US010305440B2

(12) United States Patent
Feng et al.

(10) Patent No.: US 10,305,440 B2
(45) Date of Patent: May 28, 2019

(54) BENT E-PLANE ALL METAL SEPTUM FILTERS FOR WIRELESS COMMUNICATION SYSTEM

(71) Applicant: ZTE CORPORATION, Shenzhen (CN)

(72) Inventors: Zhiping Feng, Chapel Hill, NC (US); Zhou Li, Xi'an (CN); Edwin Nealis, Cary, NC (US); Ying Shen, Chapel Hill, NC (US)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 15/588,450

(22) Filed: May 5, 2017

(65) Prior Publication Data

US 2018/0323766 A1   Nov. 8, 2018

(51) Int. Cl.
H01P 1/207    (2006.01)
H03H 7/01    (2006.01)
H01P 1/02    (2006.01)

(52) U.S. Cl.
CPC ............ *H03H 7/0161* (2013.01); *H01P 1/02* (2013.01); *H01P 1/207* (2013.01)

(58) Field of Classification Search
CPC .. H01P 1/207; H01P 1/222; H01P 1/02; H01P 1/022; H01P 1/025; H01P 1/027; H01P 1/042; H01P 7/00; H01P 3/12; H01P 3/123; H03H 7/0161
USPC .................................. 333/208, 209, 210, 211
See application file for complete search history.

(56) References Cited

U.S. PATENT DOCUMENTS

| 6,876,277 | B2 | 4/2005 | Cooper | |
| 2003/0117243 | A1* | 6/2003 | Cooper | H01P 1/207 333/208 |
| 2007/0139135 | A1 | 6/2007 | Ammar et al. | |
| 2015/0236392 | A1* | 8/2015 | Iwanaka | H01P 1/207 333/208 |

OTHER PUBLICATIONS

Glubokov et al., "Compact Filters Using Metal-Dieletric Inserts," Microwave Integrated Circuits Conference (EUMIC), 2012 7th European, IEEE, Oct. 29, 2012, 4 pgs.
ZTE Corporation, Extended European Search Report, EP18170776.1, dated Sep. 19, 2018, 10 pgs.

* cited by examiner

Primary Examiner — Stephen E. Jones
(74) Attorney, Agent, or Firm — Duane Morris LLP

(57) ABSTRACT

A band-pass filter for a wireless communications signal is provided. The band-pass filter includes a first element and a second element that mates with the first element to form a waveguide. The formed waveguide comprises a first linear segment and a second linear segment coupled by a first angular bend. The band-pass filter further includes an insert plate disposed between the first element and the second element along a direction of propagation of the waveguide. The direction of propagation follows the angular bend in the waveguide. In some embodiments, the band-pass filter is an E-plane filter. In some embodiments, the band-pass septum filter has a shorter length along an x-direction than a straight septum filter with the same performance.

13 Claims, 7 Drawing Sheets

US 10,305,440 B2

BENT E-PLANE ALL METAL SEPTUM FILTERS FOR WIRELESS COMMUNICATION SYSTEM

TECHNICAL FIELD

The present disclosure relates to E-plane septum filters, and in particular, but not limited to, E-plane filters for microwave receivers and transmitters.

BACKGROUND

Microwave radios play an increasingly important role in backhaul connectivity. Radio transmitters and receivers require filters to suppress unwanted frequencies. For example, because of governmental regulations (e.g., FCC regulations), a transmitter will be permitted to transmit only within a particular range (band) of frequencies. On the other hand, a receiver may need to suppress unwanted signals at different frequencies generated by the transmitter, or received from an external source, which would adversely affect the performance of the receiver.

SUMMARY

A band-pass filter for a wireless communications signal is provided. The band-pass filter includes a first element and a second element that mates with the first element to form a waveguide. The formed waveguide comprises a first linear segment and a second linear segment coupled by a first angular bend. The band-pass filter further includes an insert plate disposed between the first element and the second element along a direction of propagation of the waveguide. The direction of propagation follows the angular bend in the waveguide. In some embodiments, the band-pass filter is an E-plane filter. In some embodiments, the band-pass septum filter has a shorter length along an x-direction than a straight septum filter with the same performance.

In some embodiments, the waveguide has a rectangular cross-section perpendicular to the direction of propagation and each of the first element and the second element comprises a three-sided half-tube forming half of the rectangular cross-section.

In some embodiments, the waveguide of the filter includes a triangular section corresponding to the first angular bend.

In some embodiments, the insert plate is formed of a single piece of material. In some embodiments, the insert plate comprises a flat metal sheet having a plurality of resonant cavities comprising portions removed from the flat sheet. In some embodiments, the insert plate includes at least one band stop resonator shaped to provide a transmission zero at finite frequencies in a transfer function of the waveguide (e.g., using an extracted-pole technique). In some embodiments, the insert plate includes at least one resonant cavity within the first angular bend. In some embodiments, the at least one resonant cavity within the first angular bend is a triangular resonant cavity.

In some embodiments, the first angular bend turns the direction of propagation of the waveguide by 90 degrees. In some embodiments, the first angular bend turns the direction of propagation of the wave guide at an acute or obtuse angle other than 90 degrees.

In some embodiments, the first angular bend has a radius of curvature less than 10 mm.

In some embodiments, the band-pass septum filter passes a band of frequencies used in wireless backhaul communication. In some embodiments, the band-pass septum filter passes a band of frequencies used in an extremely high frequency (EHF) range.

BRIEF DESCRIPTION OF DRAWINGS

For a better understanding, reference should be made to the following detailed description taken in conjunction with the accompanying drawings.

Like reference numerals refer to corresponding parts throughout the drawings.

DETAIL DESCRIPTIONS

Reference will now be made in detail to embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. With reference now to the figures, exemplary block diagrams of data processing environments are provided in which illustrative embodiments may be implemented. It should be appreciated that these figures are only exemplary and are not intended to assert or imply any limitation with regard to the environments in which different embodiments may be implemented. Many modifications to the depicted environments may be made.

Figure 1:
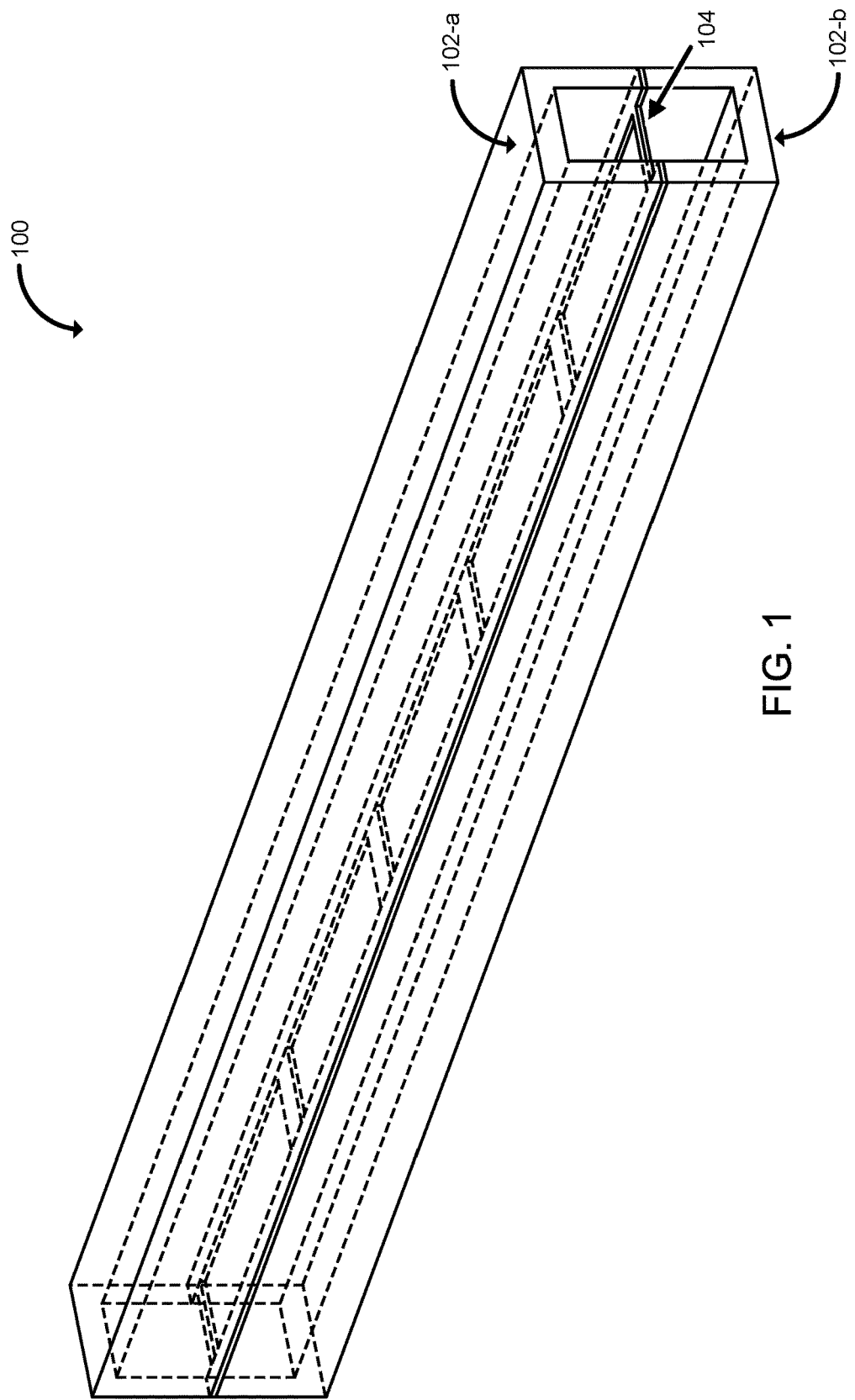
FIG. 1 illustrates a straight E-plane septum filter having an insert plate, in accordance with some embodiments.

FIG. 1 illustrates an E-plane septum filter 100 in accordance with some embodiments. In some embodiments, septum filter 100 is a band-pass filter for wireless communications signals. In some embodiments, E-plane septum filter 100 passes a band of frequencies used in wireless backhaul communication. In some embodiments, the E-plane septum filter 100 passes a band of frequencies in an extremely high frequency (EHF) range.

E-plane septum filter 100 includes first element 102-$a$ (e.g., a cover) and second element 102-$b$ (e.g., a base) that mates with first element 102-$a$ to form a waveguide (e.g., each of first element 102-$a$ and second element 102-$b$ is half of the waveguide). The formed waveguide comprises a linear segment. In some embodiments, first element 102-$a$ and second element 102-$b$ are made of a conductive material (e.g., metal). In some embodiments, when mated, the waveguide is a hollow tube with a rectangular cross-section perpendicular to a direction of propagation (that is, hollow with the exception of insert plate 104, as described below).

E-plane septum filter 100 further includes insert plate 104 (e.g., a septum insert) disposed between (e.g., sandwiched between) first element 102-*a* and second element 102-*b* along the direction of propagation of the waveguide. As used herein, the term direction of propagation means an axis of propagation, since electromagnetic waves can typically propagate equally well forwards or backwards along a waveguide.

Figure 2:
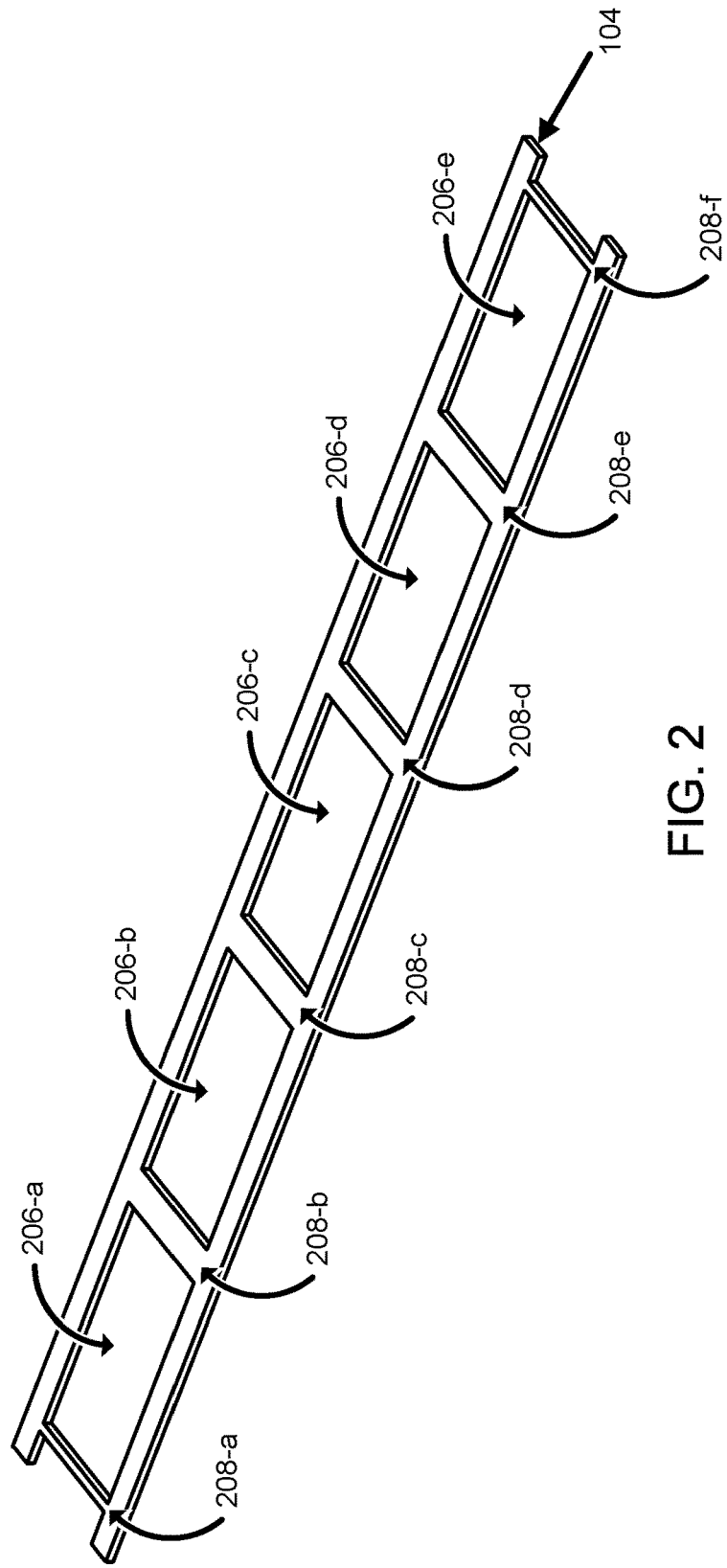
FIG. 2 illustrates in further detail the insert plate of the straight E-plane septum filter shown in FIG. 1, in accordance with some embodiments.

FIG. 2 illustrates insert plate 104 in further detail, in accordance with some embodiments. In some embodiments, insert plate 104 is a flat sheet (e.g., a flat sheet of 0.2 mm sheet metal). In some embodiments, insert plate 104 is made of copper, nickel, or steel. Insert plate 104 includes a plurality of resonant cavities 206 (e.g., resonant cavities 206-*a* through 206-*e*) and a plurality of conductive septa 208 (e.g., conductive septa 208-*a* through 208-*f*). In some embodiments, resonant cavities 206 comprise a dielectric material. In some embodiments, resonant cavities 206 are portions removed from the flat sheet (e.g., unfilled gaps, wherein air serves as the dielectric material). Resonant cavities have slightly different lengths so that they resonate at slightly different frequencies, giving rise to a "band" that passed by the band-pass filter.

In microwave communications at moderately high frequencies, for example, carrier frequencies in the range of 10 to 30 GHz, the lengths of the resonators in filter are long. Further, the frequency band for each of the receive and transmit channels may have a width of only one percent of the center frequency and the center frequencies may be separated by a frequency band of similar width. Thus, a waveguide filter suitable for such an application must provide a relatively narrow pass band with a sharp roll-off, and therefore such a filter requires a relatively large number of poles. One problem with such a filter design is that as the number of poles increases, the waveguide becomes longer and therefore requires a larger housing which adds to the cost and makes it difficult to integrate with other system components. The remaining description and accompanying figures illustrate embodiments that address this problem.

Figure 3:
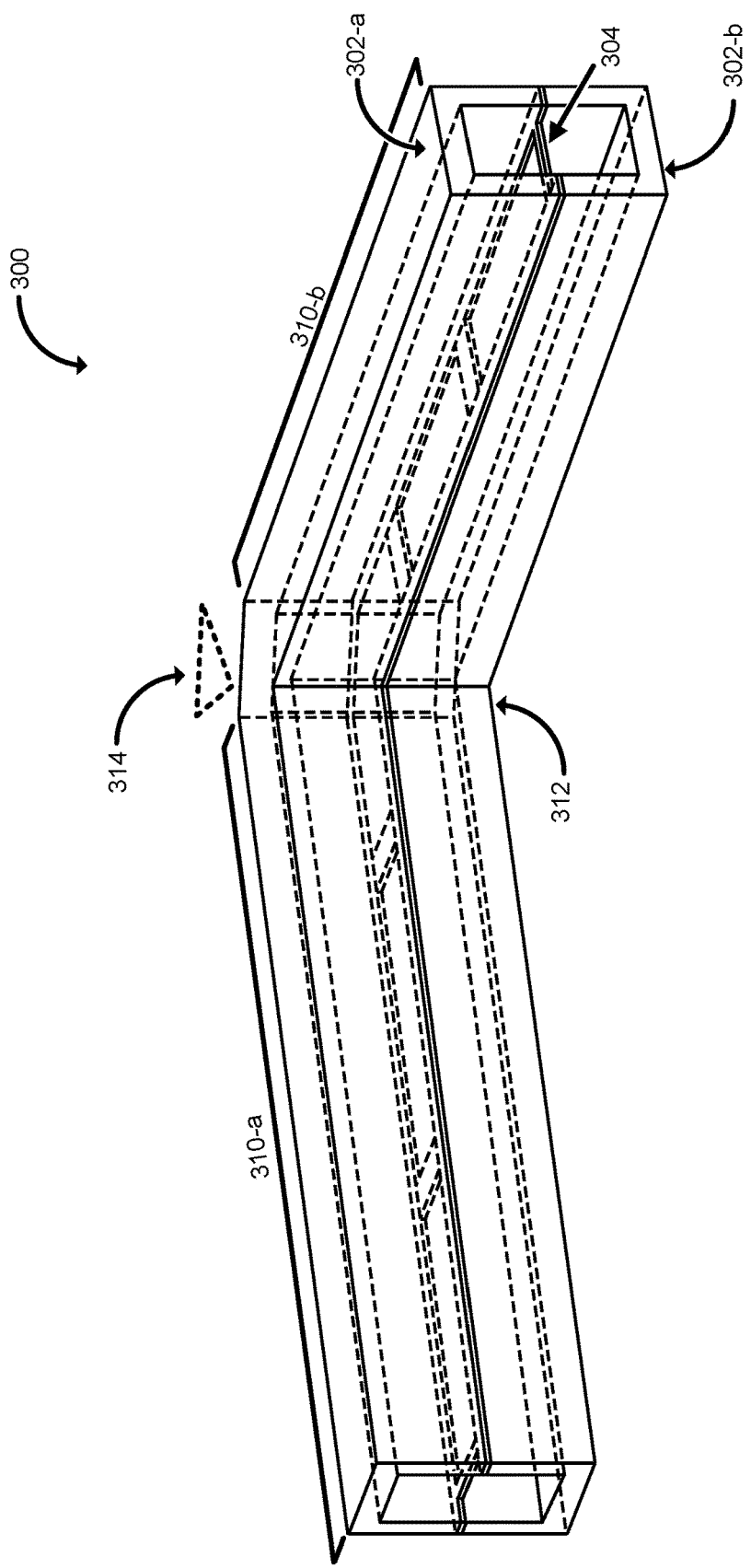
FIG. 3 illustrates a bent E-plane septum filter having an insert plate, in accordance with some embodiments.

FIG. 3 illustrates E-plane septum filter 300 in accordance with some embodiments. In some embodiments, E-plane septum filter 300 is a band-pass filter for wireless communications signals. In some embodiments, E-plane septum filter 300 passes a band of frequencies used in wireless backhaul communication. In some embodiments, the E-plane septum filter 300 passes a band of frequencies in an extremely high frequency (EHF) range. In some embodiments, E-plane septum filter 300 is a two-terminal device. E-plane septum filter 300 has a shorter length along an x-direction (e.g., any arbitrary direction) than a straight septum filter with the same performance, making E-plane septum filter 300 more compact and better suited for wireless radios, especially at lower frequencies.

E-plane septum filter 300 includes first element 302-*a* (e.g., a cover) and second element 302-*b* (e.g., a base) that mates with first element 302-*a* to form a waveguide (e.g., each of first element 302-*a* and second element 302-*b* is half of the waveguide). In some embodiments, first element 302-*a* and second element 302-*b* are formed from a conductive material (e.g., metal). In some embodiments, when mated, the waveguide is a hollow tube with a rectangular cross-section (that is, hollow with the exception of septum 304, as described below). In some embodiments, each of first element 302-*a* and second element 302-*b* comprises a three-sided half-tube forming half of the rectangular cross-section (e.g., the cross-section is rectangular perpendicular to the direction of propagation). In some embodiments, first element 302-*a* and second element 302-*b* are mirror images of one another.

E-plane septum filter 300 further includes insert plate 304 (e.g., a septum insert) disposed between (e.g., sandwiched between) first element 302-*a* and second element 302-*b* along a direction of propagation of the waveguide. In some embodiments, septum 304 lies along a mid-plane of E-plane septum filter 300.

The formed waveguide includes first linear segment 310-*a* and second linear segment 310-*b* coupled by first angular bend 312. In some embodiments, first angular bend 312 changes the direction of propagation of the waveguide. As used herein, the term "direction of propagation of the waveguide" tracks the waveguide (e.g., follows the direction of the tube). For example, the direction of propagation of the waveguide along first linear segment 310-*a* is different from the direction of propagation of the waveguide along second linear segment 310-*b*, but are each the direction of propagation of the waveguide along their respective segments. In some embodiments, first angular bend 312 turns the direction of propagation of the wave guide by 90 degrees (e.g., first angular bend 312 is a right angle bend). In some embodiments, the direction of propagation at one terminal (e.g., the input) of the waveguide (e.g., of E-plane septum filter 300) differs from the direction of propagation at another terminal (e.g., the output) of the waveguide. In some embodiments, the difference between the direction of propagation at the input and the direction of propagation at the output of the waveguide is 90 degrees. Thus, in some embodiments, E-plane septum filter 300 is an L-shaped waveguide.

In some embodiments, the direction of propagation at the input and the direction of propagation at the output are the same. To that end, although not shown in the Figures, E-plane septum filter 300 includes a plurality of angular bends (e.g., N angular bends, where N is an integer greater than or equal to 2). In some embodiments, E-plane septum filter 300 includes a plurality of straight sections (e.g., N+1 straight sections). In some embodiments, E-plane septum filter 300 is a chicane structure, having four angular bends and five straight sections and leaving the direction of propagation at the output the same as the direction of propagation at the input. The various principles of this disclosure remain the same whether there is one angular bend or more than one angular bend.

In some embodiments, the angular bend is a sharp angle rather than a curve. In some embodiments, first angular bend 312 has a radius of curvature that is less than 10 mm on the inside of the bend. In some embodiments, first angular bend 312 has a radius of curvature on the outside that is substantially equal to the radius of curvature on the inside of the bend (e.g., as occurs when first angular bend 312 is formed by cutting a section of a waveguide at an angle and welding the pieces together). In such cases, when first angular bend 312 is formed by a plurality of cut straight pieces, first angular bend 312 is a miter bend. As used herein, the term angular bend means that the difference between a radius of curvature at the inside of a respective bend (e.g., first angular bend 312) and a radius of curvature at an outside of the respective bend is less than the distance between the inside of the bend and the outside of the bend (i.e., the curvatures at the inside of the bend and the outside of the bend do not share a common center point). In some embodiments, E-plane septum filter 300 is non-curvilinear. In some embodiments, E-plane septum filter 300 consists of straight sections. E-plane septum filter 300 is non-curvilinear when each of its bends is an angular bend.

Being non-curvilinear facilitates fabrication of E-plane septum filter 300 because it can be made using off the shelf waveguides, and also facilitates integration into existing radio devices, where straight features are generally appreciated. For example, in some embodiments, first element 302-a and second element 302-b each comprises a plurality of welded sections, where a respective weld between two straight sections creates first angular bend 312, so that the radius of curvature is effectively zero on the inside of the bend. As a result, in some embodiments, the waveguide includes a triangular section corresponding to the first angular bend 312 (a footprint 314 of the triangular section of E-plane septum filter 300 is shown merely as a visual aid).

Figure 4:
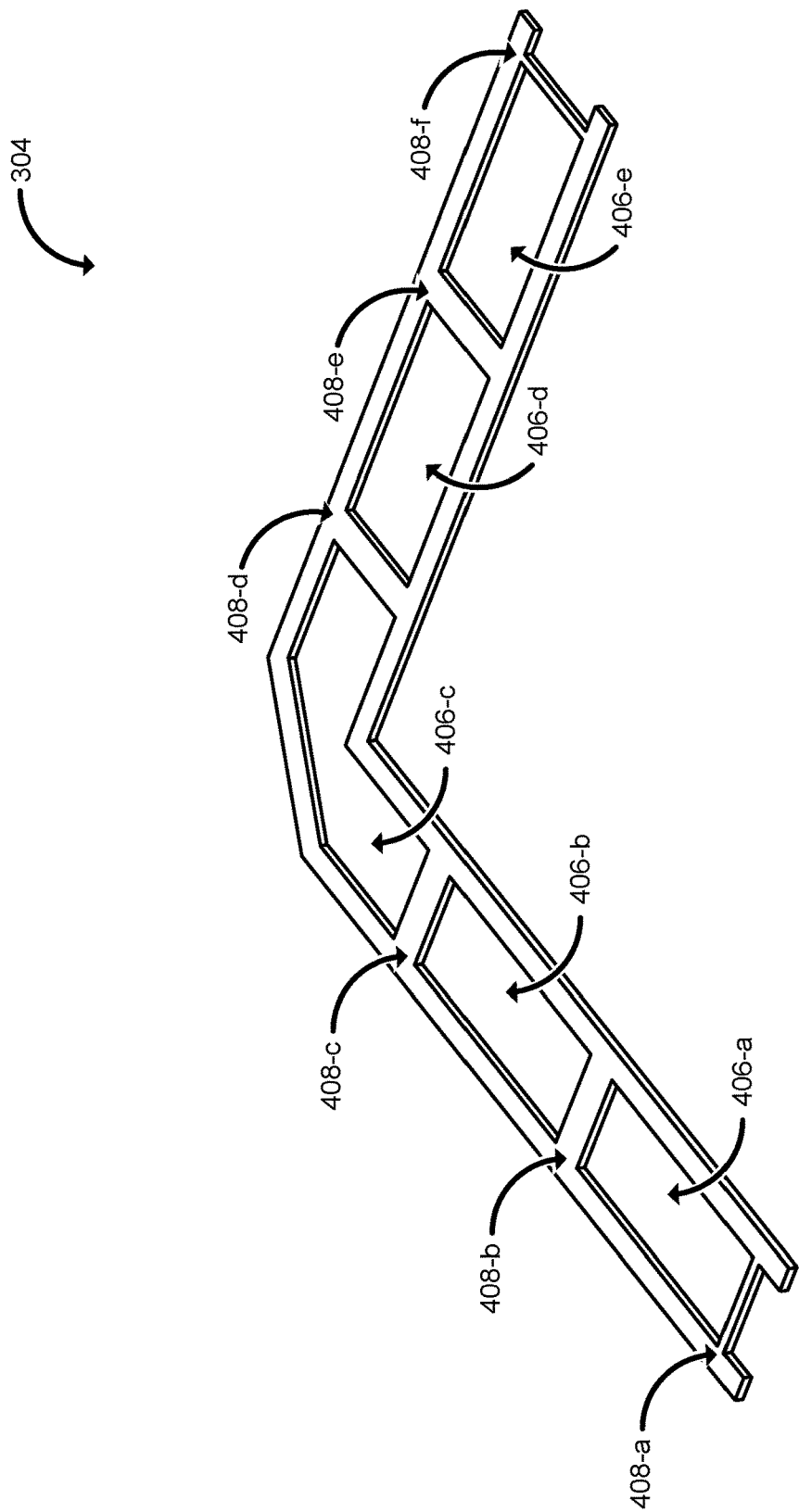
FIG. 4 illustrates in further detail the insert plate of the bent E-plane septum filter shown in FIG. 3, in accordance with some embodiments.

FIG. 4 illustrates insert plate 304 in further detail, in accordance with some embodiments. In some embodiments, insert plate 304 is a flat sheet (e.g., a flat sheet of 0.05-0.2 mm sheet metal). In some embodiments, insert plate 304 is made of a metal or metal alloy such as copper and nickel. In some embodiments, septum 304 is polygonal (e.g., a footprint of septum 304 has straight-edges).

Figure 5:
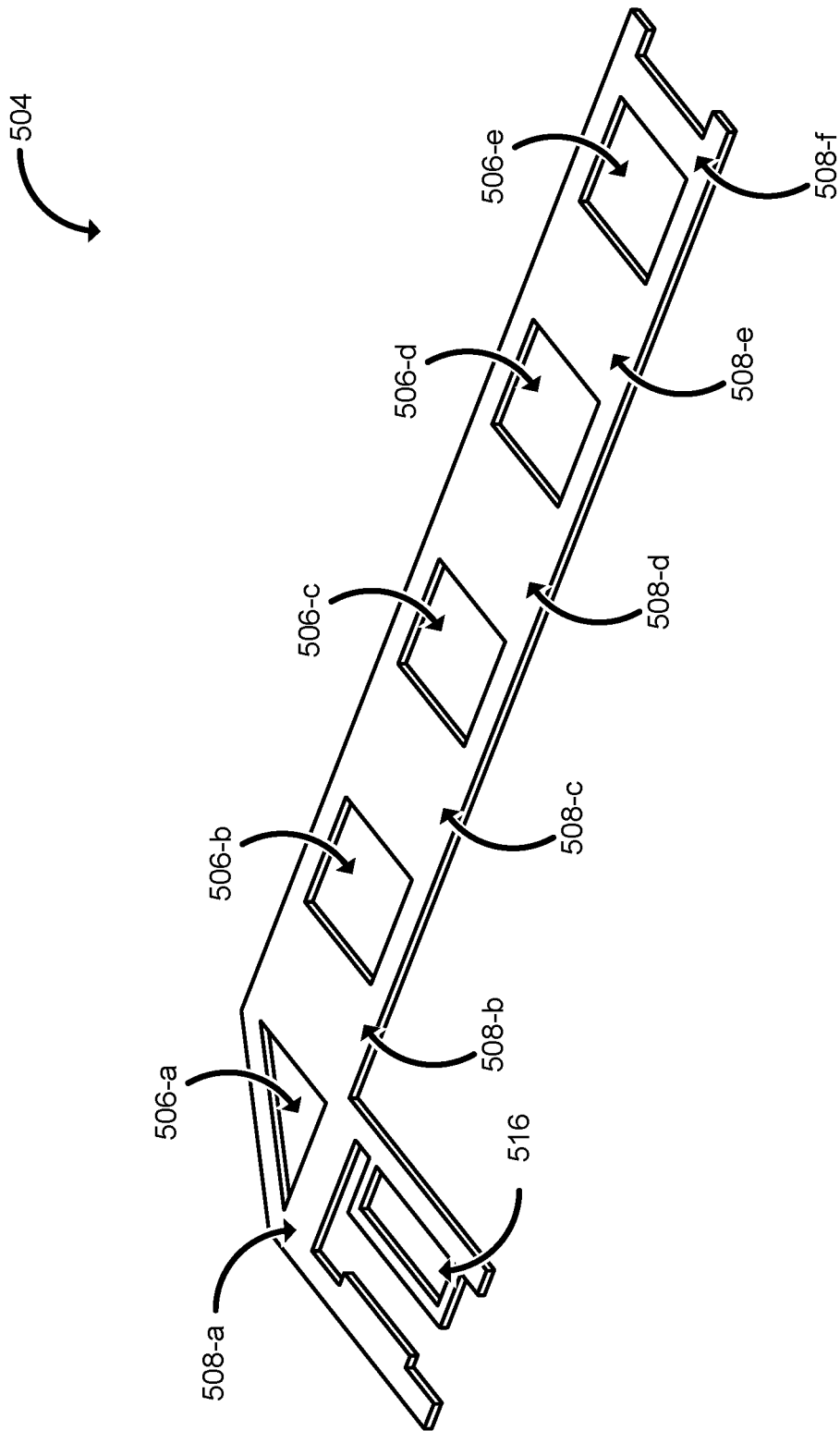
FIG. 5 illustrates another insert plate for an E-plane septum filter, in accordance with some embodiments.
Figure 6:
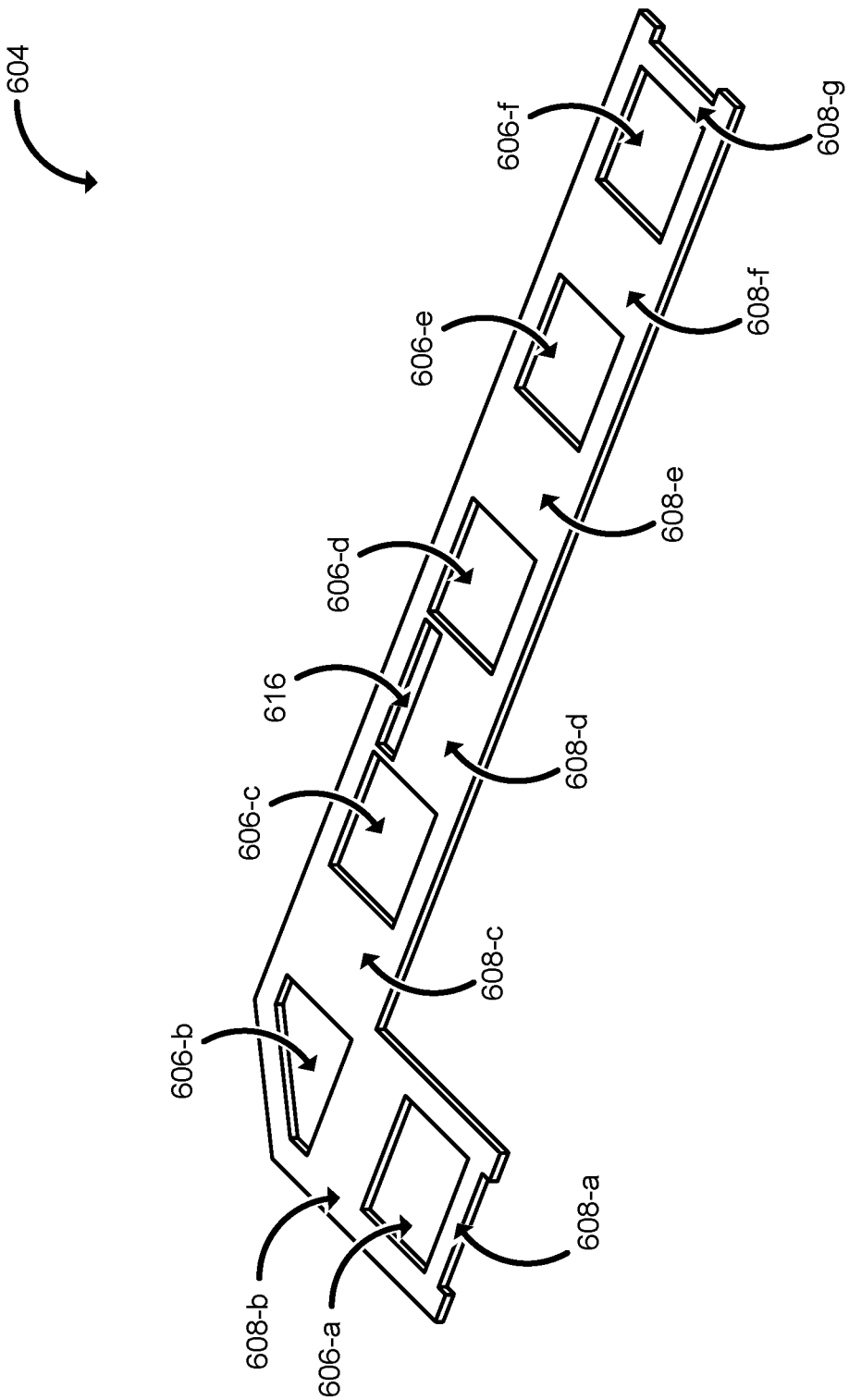
FIG. 6 illustrates another insert plate for an E-plane septum filter, in accordance with some embodiments.

Insert plate 304 includes a plurality of resonant cavities 406 (e.g., resonant cavities 406-a through 406-e) and a plurality of conductive septa 408 (e.g., conductive septa 408-a through 408-f). In some embodiments, insert plate 304 includes a bent resonant cavity 406-c (e.g., resonant cavities 406 corresponding to the linear portions of the waveguide are rectangular, but insert plate 304 also includes a resonant cavity 406-c which is polygonal but not rectangular). In some embodiments, resonant cavity 406-c, corresponding to first angular bend 312 in E-plane septum filter 300, has seven sides (as shown). In some embodiments, resonant cavity 406-c, corresponding to first angular bend 312 in E-plane septum filter 300, is triangular (FIG. 5). In some embodiments, resonant cavity 406-c, corresponding to first angular bend 312 in E-plane septum filter 300, has five sides (FIG. 6). In some embodiments, resonant cavities 406 comprise a dielectric material. In some embodiments, resonant cavities 406 are portions removed from the flat sheet (e.g., unfilled gaps, wherein air serves as the dielectric material).

In some embodiments, resonant cavities 406 are designed to resonate at slightly different frequencies, giving rise to a "band" that is passed by the band-pass filter. Resonant cavity 406-c can be designed so that its resonant frequency is not changed as compared to a straight resonant section, leaving the performance of E-plane septum filter 300 unaffected.

In some embodiments, first linear segment 310-a and second linear segment 310-b have equal lengths, and insert plate 304 has an equal number of resonant cavities 406 on each side of first angular bend 312. Placing the bend at the center allows the length of any side of E-plane septum 300 to be reduced by about 40% as compared to a straight E-plane septum filter with the same performance. The bend need not be at the center, however, as shown FIGS. 5 and 6.

Insert plate 304 is easy to make. An outline of insert plate 304 can be punched or cut in sheet metal, which is especially easy when insert plate 304 is polygonal, and then resonant cavities 406 can be punched, cut, or etched away (e.g., using photo-etching).

FIGS. 5 and 6 illustrate additional insert plates, in accordance with various embodiments. Unless otherwise noted, the insert plates shown in FIGS. 5 and 6 are analogous to those described in FIG. 1-4. For example, one of ordinary skill in the art will understand how to incorporate the septa shown in FIGS. 5 and 6 into a waveguide to form an E-plane septum filter, e.g., by positioning the respective septa in the mid-plane of a waveguide having the same shape (footprint) as the respective insert plate (as shown in FIGS. 1 and 3). For brevity, these details are not repeated here.

FIG. 5 illustrates an insert plate 504 for an E-plane septum filter, in accordance with some embodiments. Insert plate 504 includes a plurality of resonant cavities 506 (e.g., resonant cavities 506-a through 506-e) and a plurality of conductive septa 508 (e.g., conductive septa 508-a through 508-f). Unlike insert plate 304 (FIGS. 3-4), insert plate 504 has a different number of resonant cavities on different sides of the bend. In this case, insert plate 504 includes a band stop resonator 516 on one side of the bend and four resonant cavities 506 on the other side). Insert plate 504 includes a triangular resonant cavity 506-a at the bend.

In addition, insert plate 504 includes a band stop resonator 516 shaped (e.g., using an extracted-pole technique) to provide a transmission zero in a transfer function of the filter. A transmission zero is a frequency at which the transfer function of a linear two-port network has zero transmission. By convention, the physical feature of insert plate 504 that results in the transmission zero of the transfer function is also referred to as a transmission zero 516 (e.g., insert plate 504 has a transmission zero 516). Design of transmission zeroes is beyond the scope of this disclosure and is frequently aided by computer simulation software. Transmission zero 516 is incorporated into insert plate 504, but as shown in FIG. 6, a transmission zero can also be fabricated where a septum would otherwise be. Because transmission zeroes are incorporated into an existing portion of the septa described herein, the overall outline of such septa are not changed by the presence of the transmission zero (and thus do not change the overall length).

Note also that the relative widths of the resonant cavities 506 and conductive septa 508 in insert plate 504 are different than the analogous features of insert plate 304. These relative sizes are also a matter of design that is typically aided by computer simulation software.

FIG. 6 illustrates an insert plate 604 for an E-plane septum filter, in accordance with some embodiments. Insert plate 604 includes a plurality of resonant cavities 606 (e.g., resonant cavities 606-a through 606-e) and a plurality of conductive septa 608 (e.g., conductive septa 608-a through 608-g). Insert plate 604 is analogous to insert plate 504 (FIG. 5) except that insert plate 604 includes a diamond-shaped (e.g., a five-sided diamond) resonant cavity 606-b at the bend and includes a transmission zero 616 at septum 608-d.

Figure 7:
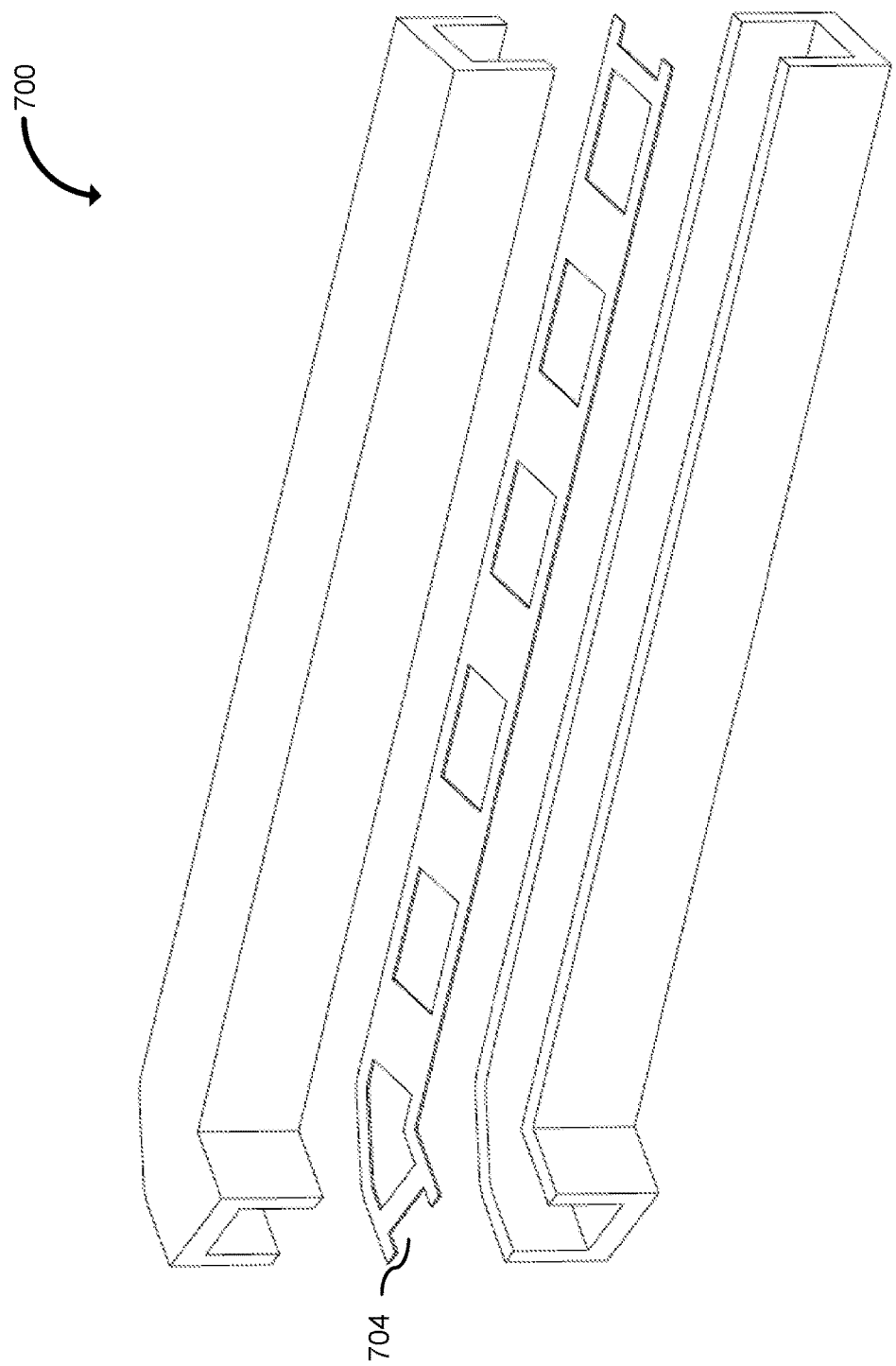
FIG. 7 illustrates an E-plane septum filter with an obtuse angle bend, in accordance with some embodiments.

FIG. 7 illustrates an E-plane septum filter 700 bent at an obtuse angle. E-plane septum filter 700 includes insert plate 704. Besides being bent at an obtuse rather than 90 degree angle, E-plane septum filter 700 is analogous to other E-plane septum filters discussed herein. Thus, E-plane septum filter 700 illustrates that the bend need not be at a 90 degree angle. Rather, the E-plane septum filters described herein can be bent at any obtuse angle or acute angle. This design can make the layout of the filter can be more flexible.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

The terminology used in the description of the embodiments herein is for the purpose of describing particular embodiments only and is not intended to limit the scope of claims. As used in the description of the embodiments and the appended claims, the singular forms "a," "an," and "the"

are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc. may be used herein to describe various elements, these elements should not be limited by these terms. These terms are only used to distinguish one element from another. For example, a first port could be termed a second port, and, similarly, a second port could be termed a first port, without departing from the scope of the embodiments. The first port and the second port are both ports, but they are not the same port.

Many modifications and alternative embodiments of the embodiments described herein will come to mind to one skilled in the art having the benefit of the teachings presented in the foregoing descriptions and the associated drawings. Therefore, it is to be understood that the scope of claims are not to be limited to the specific examples of the embodiments disclosed and that modifications and other embodiments are intended to be included within the scope of the appended claims. Although specific terms are employed herein, they are used in a generic and descriptive sense only and not for purposes of limitation.

The embodiments were chosen and described in order to best explain the underlying principles and their practical applications, to thereby enable others skilled in the art to best utilize the underlying principles and various embodiments with various modifications as are suited to the particular use contemplated.

What is claimed is:

1. A band-pass filter for a wireless communications signal, comprising:
    a first element;
    a second element that mates with the first element to form a waveguide, wherein the formed waveguide comprises a first linear segment and a second linear segment coupled by a first angular bend; and
    an insert plate disposed between the first element and the second element along a direction of propagation of the waveguide, wherein the direction of propagation follows the angular bend in the waveguide;
    wherein the waveguide includes a triangular section corresponding to the first angular bend.

2. The band pass filter of claim 1, wherein the waveguide has a rectangular cross-section perpendicular to the direction of propagation and each of the first element and the second element comprises a three-sided half-tube forming half of the rectangular cross-section.

3. The band pass filter of claim 1, wherein the first angular bend turns the direction of propagation of the waveguide by 90 degrees.

4. The band pass filter of claim 1, wherein the first angular bend turns the direction of propagation of the wave guide at an acute or obtuse angle other than 90 degrees.

5. The band pass filter of claim 1, wherein the band-pass filter has a shorter length along an x-direction than a straight septum filter with the same performance.

6. The band pass filter of claim 1, wherein the first angular bend has a radius of curvature less than 10 mm.

7. The band pass filter of claim 1, wherein the band-pass filter is an E-plane filter.

8. The band pass filter of claim 1, wherein the band-pass septum filter passes a band of frequencies used in wireless backhaul communication.

9. The band-pass filter of claim 8, wherein the band-pass septum filter passes a band of frequencies used in an extremely high frequency (EHF) range.

10. The band pass filter of claim 1, wherein the insert plate is formed of a single piece of material.

11. The band-pass filter of claim 10, wherein the insert plate comprises a flat metal sheet having a plurality of resonant cavities comprising portions removed from the flat sheet.

12. The band-pass filter of claim 10, wherein the insert plate includes at least one band stop resonator shaped to provide a transmission zero feature at finite frequencies in in a transfer function of the waveguide.

13. The band-pass filter of claim 10, wherein the insert plate includes at least one resonant cavity within the first angular bend.

* * * * *